United States Patent [19]

Powell

[11] Patent Number: 4,977,366
[45] Date of Patent: Dec. 11, 1990

[54] HIGH FREQUENCY POWER SENSING DEVICE
[75] Inventor: Robert C. Powell, Gaithersburg, Md.
[73] Assignee: Lucas Weinschel Inc., Gaithersburg, Md.
[21] Appl. No.: 260,501
[22] Filed: Oct. 7, 1988
[51] Int. Cl.⁵ .................................. G01R 21/04
[52] U.S. Cl. ..................... 324/95; 324/106
[58] Field of Search ............. 324/58 R, 58 A, 95, 324/98, 118, 106; 341/118–120; 330/10; 374/116, 122, 127, 128, 183, 185

[56] References Cited
U.S. PATENT DOCUMENTS

| | | | |
|---|---|---|---|
| 2,449,072 | 9/1948 | Houghton | 324/95 |
| 2,510,930 | 6/1950 | MacLeish | 324/118 |
| 2,565,922 | 8/1951 | Howard | 324/106 |
| 2,799,826 | 7/1957 | Eberle | 324/95 |
| 2,933,691 | 4/1960 | Stair | 330/10 |
| 2,939,080 | 5/1960 | Hurwitz | 330/10 |
| 2,980,861 | 4/1961 | Popowsky | 324/118 |
| 3,047,803 | 7/1962 | Sorger et al. | 324/95 |
| 3,054,948 | 9/1962 | Rymaszewski | 324/58 A |
| 3,142,017 | 7/1964 | Weinschel | 324/95 |
| 3,148,335 | 9/1964 | Young | 330/10 |
| 3,200,331 | 8/1965 | Bloom et al. | 324/95 |
| 3,270,282 | 8/1966 | Weinschel | 324/95 |
| 3,423,675 | 1/1969 | Kraus et al. | 324/58 B |
| 3,424,981 | 1/1969 | Erdman | 324/118 |
| 3,430,125 | 2/1969 | Povenmire et al. | 324/118 |
| 3,501,696 | 3/1970 | Riley | 324/95 |
| 3,535,637 | 10/1970 | Goransson | 324/130 |
| 3,541,320 | 11/1970 | Beall | 341/118 |
| 3,555,298 | 1/1971 | Neelands | 341/120 |
| 3,577,074 | 5/1971 | Praglin | 324/98 |
| 3,626,290 | 12/1971 | Aslan | 324/95 |
| 3,667,041 | 5/1972 | Senour | 324/130 |
| 3,693,078 | 9/1972 | Sorger | 324/58 B |
| 3,694,746 | 9/1972 | Hopfer | 324/106 |
| 3,735,274 | 5/1973 | Nelson | 330/1 A |
| 3,739,269 | 6/1973 | Weinschel | 324/95 |
| 3,763,431 | 10/1973 | Hopfer | 324/95 |
| 3,781,869 | 12/1973 | Sudnick et al. | 341/119 |
| 3,818,336 | 6/1974 | Marshall | 324/118 |
| 3,893,103 | 7/1975 | Prill | 341/118 |
| 3,928,800 | 12/1975 | Stenglein | 324/95 |
| 4,104,583 | 8/1978 | Engen | 324/58 R |
| 4,223,264 | 9/1980 | Yamamura et al. | 324/106 |
| 4,359,682 | 11/1982 | Winslow | 324/58 B |
| 4,427,361 | 1/1984 | Riblet et al. | 324/58 B |
| 4,489,271 | 12/1984 | Riblet | 324/58 B |
| 4,521,728 | 6/1985 | Li | 324/58 R |
| 4,621,226 | 11/1986 | Powell | 324/58 B |
| 4,628,256 | 12/1986 | Powell | 324/95 |
| 4,786,859 | 11/1988 | Arseneau et al. | 324/98 |

Primary Examiner—Salvatore Cangialosi
Attorney, Agent, or Firm—Howard L. Rose

[57] ABSTRACT

The present invention relates to devices utilized for measurement of high frequency and microwave power. More specifically, the present invention relates to apparatus and technique for measurement of power including the construction and configuration of a power-sensing probe for detection of the power level of a high frequency or microwave signal.

7 Claims, 1 Drawing Sheet

HIGH FREQUENCY POWER SENSING DEVICE

BACKGROUND OF THE INVENTION

A wide variety of types and configurations of instruments for sensing and measuring high frequency and microwave power are known. These prior art techniques suffer from several inherent drawback. These drawbacks include: mismatch errors, non-linearity, limitations on the frequency range of operation, and complexity of the required equipment.

The usually used dc bridge circuits set the dc resistance to a value which would make the input dc resistance and hence the RF input resistance equal to the characteristic resistance of the input transmission line. The change in direct current necessary to maintain the dc resistance constant in the presence of the ac power to be measured, provides a substituted dc power measurement for the ac power. This technique however is valid only if the RF and dc resistances are equal which normally they are not. The present invention also uses the substituted dc power measurement approach for measuring ac power but adjusts the dc input to compensate for changes in RF resistance as a function of ac frequency.

Methods are also known which utilize pairs of thermistors. Unless the two thermistors have exactly the same resistance and temperature coefficients of resistance which they normally do not, there will be a linearity error due to unequal division of the power.

When using a pair of thermistors, bypass capacitors are required because both thermistors should not be grounded. Capacitors are also used to prevent dc current from flowing through the RF input transmission line. These capacitors determine the frequency limits of operation.

Known methods also use bridges or feedback techniques to control the resistance of the thermistors and precise voltmeters to measure the dc voltage across the thermistors. In automated systems the voltmeter is also required to convert the dc voltages to digital signals for use by computer circuits.

BRIEF SUMMARY OF THE INVENTION

The present invention uses a single thermistor, directly converts a digital signal to the current through the thermistor, and converts the voltage across the thermistor to a digital signal. The change of the digitized dc signals from no RF power to power to be measured provides the measure of RF power by the substituted dc method. The above approach eliminates the need for bridges and voltmeters between the power sensor and computer circuits. This approach permits the computer to set the dc resistance of the thermistor to the proper value to provide optimum matching at the desired frequency and to calculate the dc power dissipated in the thermistor. The present invention using only a single thermistor, eliminates the need for bypass capacitors and the nonlinearity error produced by thermistor pairs. The dc blocking capacitor in this invention, not being an integral part of the power sensor, is interchangeable permitting a wide range of operating frequencies with a single basic power sensor.

The present invention teaches a configuration wherein a single grounded thermistor is connected to the center conductor of the input transmission line so that the thermistor is physically and electrically in line with the center conductor. A very fine resistance wire, for instance, 0.0005 inch diameter, with a high, temperature insensitive resistance per unit length is connected to the center conductor of the input transmission line perpendicular to the power flow. In such a configuration the resistance wire forms an inductive junction with the input transmission line and appears as a high impedance and high loss transmission line at the higher frequencies of the signals to be measured to isolate the dc source from the transmission line. At the lower frequencies the resistance wire is a resistor with resistance high compared to the characteristic resistance of the input transmission line and the resistance of the thermistor. Thus the efficiency of the power sensor need not be significantly degraded. It is recognized that a reduction of efficiency degrades the sensitivity but not necessarily the accuracy of a power sensor.

The present invention uses a single thermistor which is grounded to the common RF and dc return, therefore no bypass capacitors are used between the thermistor and ground. Also in the present invention the capacitor which is usually necessary to prevent errors from dc currents flowing in the input transmission line is not an integral part of the power sensor. This feature has several advantages. The power sensor may be used from dc to very high frequencies by interchanging the externally attached blocking capacitor. The blocking capacitor may be optimized for the frequency of use rather than compromised to obtain wide frequency bandwidths. The blocking capacitor(s) may be measured and evaluated independently of the power sensor. Instabilities due to temperature and voltage coefficients and leakage of the capacitor(s) can be reduced.

In a thermistor bead at high frequencies, typically above 10 GHz, RF current flows through the protective glass coating due to high frequency skin effect, while the dc current travels through the semiconductor in the center portion of the bead. Therefore the assumption that the resistances of the RF and dc current paths are equal is not valid. The present invention recognizes this non-equivalency of RF and dc resistance and enables the associated computer or controller to measure and adjust the dc resistance to the value which gives the best RF impedance at the frequency of use. The best RF impedance is determined by measuring the reflected RF and varying the direct current from a D/A converter until the reflection is at a minimum. This procedure is followed for a number of different frequencies to develop a sufficient number of points to provide a smooth curve that permits interpolation to determine the correct direct current for each frequency over a desired frequency range.

With the above technique and the present design features, frequencies up to 40 GHz can be processed. This feature also permits the power sensor to be used for different RF impedances since regardless of the RF impedance value the above technique is valid. Thus the present invention teaches a configuration wherein the dc resistance may be set to the desired value for RF through control of the dc current from a D/A converter. The present invention, therefore, permits improved RF matching giving lower mismatch error and higher frequency of operation.

In the present invention a resistive wire is connected perpendicular to the RF current flow at the RF side of the grounded thermistor, an accurately controlled dc voltage is imposed at the input end of the resistance wire. The voltage at the other end of the resistance wire is accurately measured without drawing significant current between the thermistor and the voltage measurement point. Thus the voltage measured is the voltage across the thermistor. The difference between the applied voltage and the measured voltage divided by the resistance of the resistance wire is the current through the thermistor. The resistance of the resistance wire is not affected by heat and thus is stable and known. An external computer or controller can determine the applied and measured voltages by means of digital signals between the computer or controller and the digital-to-analog converter controlling the applied voltage and an analog-to-digital converter determining the measured voltage. The computer or controller can initially calculate the thermistor resistance and the dc power dissipated in the thermistor and adjust the applied voltage to give the proper dc resistance at the frequency of the RF power to be measured. Thereafter, the computer or controller maintains the dc resistance at the desired value and determines the change in dc power required to maintain the resistance of the thermistor constant. This change in dc power is used with a calibration factor for the power sensor to determine the RF power applied to the power sensor. The same approach can be used to hold the RF power constant by adjusting the RF power source to maintain the voltage across the thermistor constant.

The present invention provides a simple configuration which has few parts, is easily constructed, and provides better accuracy with less associated equipment than known power sensors. The present invention does not require bridge networks, precision voltmeters or other such devices and allows RF and microwave power measurements with direct digital control. This improves performance, decreases uncertainty, increases reliability and reduces cost. Further, proper RF matching is more easily attained with the present invention.

BRIEF DESCRIPTION OF THE DRAWINGS

A better understanding of the power measurement apparatus including the power sensing probe according to the present invention will be obtained through a reference to the following detailed description, when taken in conjunction with the accompanying drawings, wherein like reference characters refer to like parts throughout the several views, and in which.

DETAILED DESCRIPTION OF A PREFERRED EXEMPLARY EMBODIMENT

Figure 1:
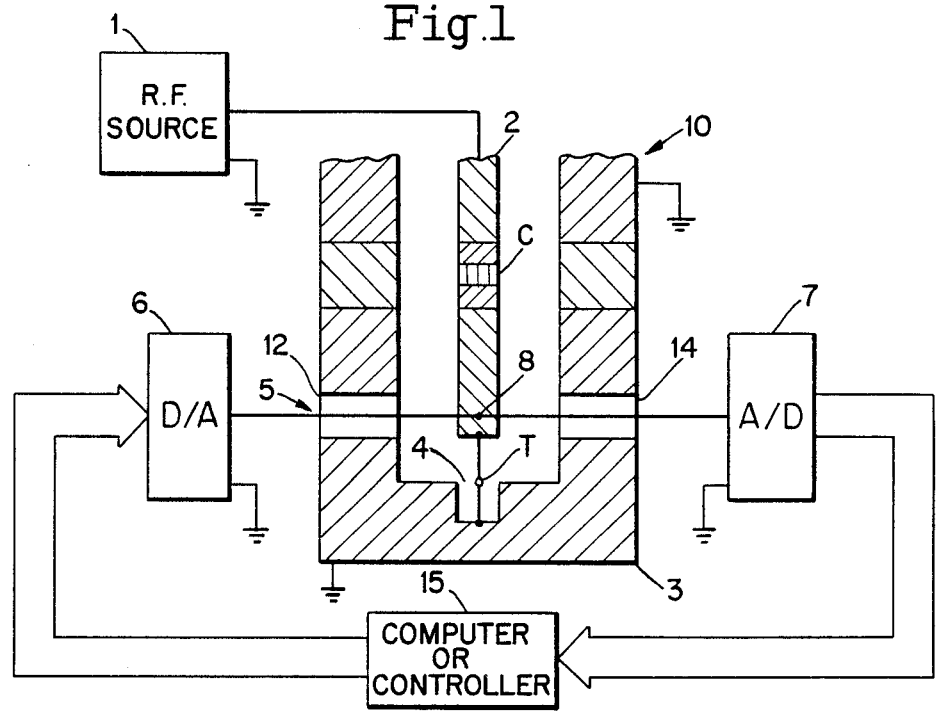
FIG. 1 is a cross-sectional view illustrating a physical configuration of the RF power apparatus including the power detection mount.
Figure 2:
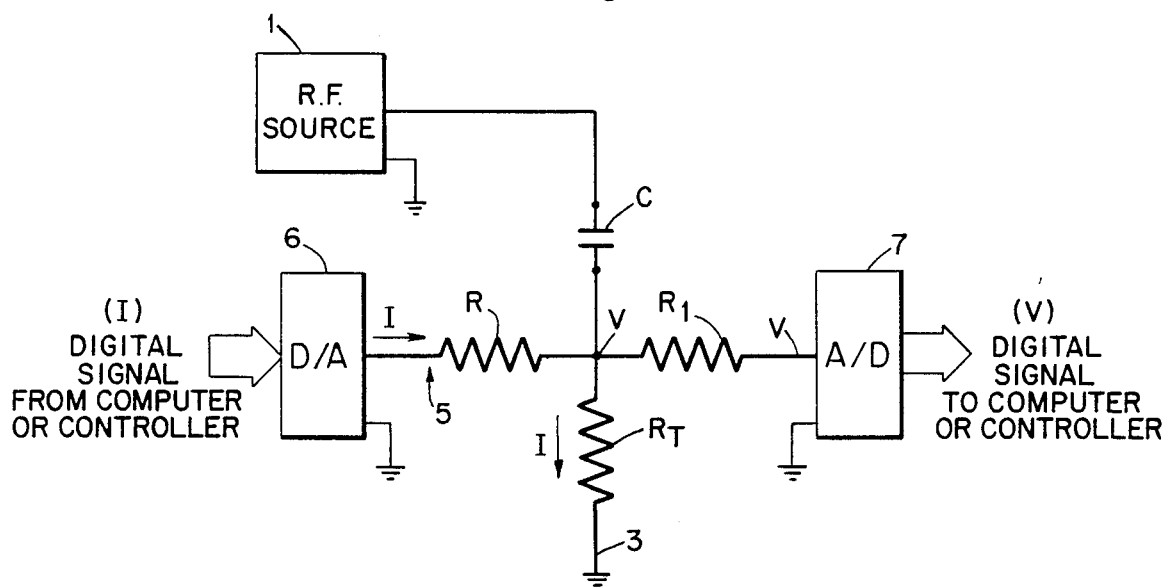
FIG. 2 is a schematic diagram illustrating the electrical equivalent of the physical configuration.

Referring specifically to FIGS. 1 and 2 of the accompanying drawings, an RF source 1 is connected to the input transmission line center conductor 2 so that the RF current flows into the center conductor 2 and returns to the RF source 1 from the grounded outer conductor 3, as illustrated in FIG. 1. Thermistor T is connected between the input conductor 2 and return conductor 3 and in space 4. Space 4 is configured and dimensioned for proper RF impedance matching. The thermistor resistance can be adjusted by the output of the D/A converter in accordance with a lookup table or chart as indicated above, and therefore resistance transformation is not required and only minimization of reactance is needed. A barretter can be utilized in place of the thermistor for power detection.

A resistance wire 5 with a very small diameter is connected to the center conductor of the input transmission line at point 8 and at right angles to the center conductor for reasons to be discussed subsequently. The resistance wire 5 proceeds through ports 12 and 14 to the outside of the power sensor where it can be connected to other devices. The ports 12 and 14 have diameters sufficiently larger than resistance wire 5 to form high impedance transmission lines.

A digital-to-analog converter 6 is connected to one end of resistance wire 5. The digital-to-analog converter 6 produces a voltage or current at its output corresponding to the digital signal at its input. Since a known voltage is produced the current may be determined from the voltage and the resistance R between the digital-to-analog converter 6 and the grounded outer conductor 3. The dc current does not flow through the input transmission line either because of high dc resistance of the source or because capacitor C is attached to the input of the power sensor for the purpose of blocking dc current flow. An analog-to-digital converter 7 connected to the other end of wire 5 draws negligible current either because of its high input resistance or because an isolation amplifier is attached to its input for the purpose of increasing its input resistance. Therefore essentially all of the dc current I flows through the thermistor T.

The analog-to-digital converter 7 provides at its output a digital signal corresponding to the voltage V at its input. Since essentially no current flows to the analog-to-digital converter, the voltage at the input to the analog-to-digital converter is the same as the voltage at junction point 8 which is the voltage V across the thermistor T.

It is known that the electrical power dissipated in a thermistor mounted as in FIG. 1 is transferred as heat from the thermistor to the environment of the thermistor. When the rate of heat transfer is equal to the constant electrical power being dissipated, the thermistor reaches an equilibrium temperature. For each equilibrium temperature the thermistor has a unique electrical resistance.

The present invention enables a computer or controller 15 to determine the resistance of the thermistor by dividing V by I where V is the thermistor voltage determined from the digital signal from the analog-to-digital converter 7 and I is the current through the thermistor determined from the digital signal into the digital-to-analog converter 6 using the thermistor voltage V and the known resistance R between the digital-to-analog converter and the junction 8.

The present invention also enables a computer or controller to adjust the resistance of the thermistor to the value desired at a given frequency by adjusting the current through the thermistor by means of the digital-to-analog converter 6 and in accordance with the above described curve or lookup table. Therefore the resistance of the thermistor can be held at a constant value automatically by the computer or by a controller when RF power is applied to the thermistor through the input transmission line.

The present invention also enables a computer or controller to determine the dc power dissipated in the thermistor by multiplying V by I where V and I are the same values used above to determine the resistance. Therefore the change in dc power required to hold the thermistor resistance constant when RF power is applied may be determined.

The ratio of the change in dc power required to hold the thermistor resistance constant to the RF power incident upon the input of the power sensor is the calibration factor of the power sensor. The ratio of the change in dc power required to hold the thermistor resistance constant to the RF power absorbed by the power sensor is the effective efficiency of the power sensor. The calibration factor or effective efficiency of the power sensor may be determined by determining the change in dc power required to hold the thermistor resistance constant when a known amount of RF power is applied to the power sensor from a calibrated source. The power sensor may then be used for measurement of RF power.

If the resistance wire 5 is reasonably symmetrical relative to junction point 8 and the resistance R is much greater than the resistance of the thermistor T then most of the RF power will be dissipated in the thermistor T. Also if the series reactance of the resistance wire is high an even larger part of the RF power will be dissipated in the thermistor. This causes the efficiency of the power sensor to be high. A higher efficiency provides more sensitivity to the power sensor but a small amount of power dissipated in the power sensor but not in the thermistor need not lower the accuracy of the power sensor. The effect of shunting some of the power around the thermistor would change the impedance match of a power sensor in which the thermistor resistance was held constant. The present invention permits the thermistor resistance to be adjusted to give optimum matching at the measurement frequency and therefore loss of RF power into resistance wire 5 need not degrade the match and accuracy.

The effect of shunting some of the RF power through the resistance wire 5 may be demonstrated by the following quantitative example. If the resistance wire has a resistance per unit length of 6000 ohms per foot and one inch of wire is used on each side of point 8 then the resistance shunting thermistor T would be 250 ohms using no resistance for the converters at each end of the wire. Thus for a thermistor resistance of 62.5 ohms, the input resistance would be 50 ohms. The current through the thermistor would be 80% of the input current and the effective efficiency would be about 0.8. If the wire had a diameter of 0.0005 inch and the distance between the wire and the outer conductor diameter was at least 0.05 inch, the transmission line impedance would be greater than 276 ohms. The transmission line impedance and the junction impedance would increase the efficiency. The above quantities and sizes are typical of one embodiment of the present invention.

The impedance offered by a ninety degree configuration of wire is a relatively high inductance giving a high impedance at high frequencies. The characteristic impedance of a transmission line can be relatively high if the center conductor has cross section dimensions which are very small relative to the other dimensions of the transmission line. For instance, the characteristic impedance of such a line is 138 Log B/A or 138 (Log B−Log A), where B is the diameter of the outer conductor and A is the diameter of the inner conductor. If the outer diameter is 0.05 inch and the inner conductor has a diameter of 0.0005 inch then in effect the impedance is primarily due to Log B. The input impedance of a transmission line with high losses is insensitive to impedance variations at the output end. The input impedance of a transmission line with moderate losses per unit length may be insensitive to the output impedance if the transmission line has sufficient length. The reactive coupling between two conductors in a transmission line may be varied relative to the resistance coupling at their junction by varying the angle between the two conductors. The configuration of the junction of resistance wire 5 and the transmission line at point 8 in the present invention utilizes some or all of the above to optimize the power sensor depending upon the application and intended frequency range of operation.

No bypass capacitors which would limit the frequency range at which the power sensor could be used are required in the present invention. The capacitor C which may be used to block dc currents from traveling along the center conductor of the input transmission line is made interchangeable in the present invention so that the useful frequency range of the power sensor may be changed by using capacitors with various values of capacitance.

A power sensor may be used for leveling an RF signal. If the impedance of the power sensor varies with frequency the level of the signal will vary with frequency even if corrections are made for variations in the effective efficiency. In the present invention the input impedance can be held more nearly constant thus providing a more nearly level signal.

A metal film or semi-conductor film can be utilized instead of a fine resistance wire 5. The film could provide the same function as the resistance wire. Resistance wire can have very low temperature coefficients of resistance, however a resistance film may be screened on the same substrata as a strip line version of the transmission line thereby allowing simpler construction.

Many varying and different embodiments may be made within the scope of the inventive concept herein taught, and many modifications may be made in the embodiment(s) herein detailed in accordance with the descriptive requirements of the law, therefore it is to be understood that the details herein are to be interpreted as illustrative and not in a limiting sense.

Once given the above disclosure, many other features, modifications and improvements will become apparent to the skilled artisan. Such features, modifications, and improvements are thus to be considered a part of this invention, the scope of which is to be determined by the following claims.

What is claimed is:

1. A device for measurement of or for maintaininq constant electrical power at radio and microwave frequencies comprising,
    a temperature sensitive resistance element,
    a variable source of accurate analog voltages,
    means for generating a digital signal in response to an analog signal,
    means for applying an RF signal across said element,
    means for applying a voltage from said variable source across said element at right angles to said means for applying said RF signal, and
    means for applying the voltage across said element to said means for generating a digital signal.

2. A device for the measurement of electrical power at radio and microwave frequencies comprising,
    a thermistor,
    a digital-to-analog converter,
    an analog-to-digital converter,
    means for connecting the output voltage of said digital-to-analog converter across said thermistor, means for applying the voltage across said thermistor to said analog-to-digital converter, and an input transmission line having a center conductor, said thermistor connected in series with said center conductor.

3. A device for the measurement of electrical power at radio and microwave frequencies according to claim 2 wherein said first and second mentioned means are a fine, high resistance per unit length wire extending between the analog output of said digital-to-analog converter and the analog input of said analog-to-digital converter, said transmission line center conductor being located at the center of and in line with said wire.

4. A device for the measurement of electrical power at radio and microwave frequencies according to claim 3 wherein said fine wire and said center conductor lie at right angles to one another.

5. A device for the measurement of electrical power at radio and microwave frequencies according to claim 4 wherein said thermistor lies between said RF transmission line center conductor and a reference potential and said analog-to-digital and digital-to-analog converters have high input and output impedances respectively extending between said fine wire and said reference potential.

6. A device for the measurement of electrical power at radio and microwave frequencies according to claim 5 wherein the resistance of said resistance wire between said thermistor and said input impedance of said analog-to-digital converter is sufficient to prevent a substantial voltage drop between said thermistor and said input impedance.

7. The method of measuring RF and microwave power comprising applying a direct current through a conductor across a temperature sensitive resistor to minimize reflected power upon application of RF and higher frequencies, applying an RF or higher frequency signal to the resistor at right angles to the dc current conductor, measuring the voltage across the resistor, adjusting the dc current across the resistor to maintain its resistance constant, and determining the difference in current and voltage across the resistor from before and then after the application of RF or higher frequency signals as a measure of RF or higher frequency power.

* * * * *